(12) United States Patent
Suo et al.

(10) Patent No.: US 11,906,551 B2
(45) Date of Patent: Feb. 20, 2024

(54) AUTOMATIC TRIGGER TYPE IDENTIFICATION METHOD, DEVICE, AND OSCILLOSCOPE

(71) Applicant: RIGOL TECHNOLOGIES (BEIJING), INC., Beijing (CN)

(72) Inventors: Shichang Suo, Suzhou (CN); Wenyu Jiang, Suzhou (CN); Yue Wang, Suzhou (CN); Tiejun Wang, Suzhou (CN); Weisen Li, Suzhou (CN)

(73) Assignee: RIGOL TECHNOLOGIES (BEIJING), INC., Beijing (CN)

( * ) Notice: Subject to any disclaimer, the term of this patent is extended or adjusted under 35 U.S.C. 154(b) by 0 days.

(21) Appl. No.: 17/776,340

(22) PCT Filed: May 29, 2020

(86) PCT No.: PCT/CN2020/093159
§ 371 (c)(1),
(2) Date: May 12, 2022

(87) PCT Pub. No.: WO2021/093309
PCT Pub. Date: May 20, 2021

(65) Prior Publication Data
US 2022/0397588 A1    Dec. 15, 2022

(30) Foreign Application Priority Data
Nov. 15, 2019    (CN) .......................... 201911118740.4

(51) Int. Cl.
*G01R 13/02*    (2006.01)
(52) U.S. Cl.
CPC ............................. *G01R 13/0254* (2013.01)

(58) Field of Classification Search
CPC .. G01R 13/0254; G01R 13/02; G01R 13/029; G01R 13/0218; G01R 31/31858;
(Continued)

(56) References Cited

U.S. PATENT DOCUMENTS

| 5,495,168 A | * | 2/1996 | de Vries | ................. | G01R 13/32 |
| | | | | | 324/121 R |
| 5,686,846 A | | 11/1997 | Holcomb et al. | | |

(Continued)

FOREIGN PATENT DOCUMENTS

| CN | 1245292 A | 2/2000 |
| CN | 1787427 A | 6/2006 |

(Continued)

OTHER PUBLICATIONS

Decision to Grant a Patent issued by the China National Intellectual Property Administration in connection with Chinese Application No. 201911118740.4, dated Nov. 3, 2021, with English-language translation.

(Continued)

*Primary Examiner* — Vinh P Nguyen
(74) *Attorney, Agent, or Firm* — CARTER, DELUCA & FARRELL LLP; George Likourezos (57) ABSTRACT

Provided are an automatic trigger type identification method and device and an oscilloscope, which belong to the field of oscilloscopes. The method includes analyzing characteristic parameter data of a to-be-triggered signal. The characteristic parameter data comprises at least one of bus protocol matching information or variation information of at least one characteristic parameter. In this way, a trigger type capable of stably triggering the to-be-triggered signal can be obtained for user selection or automatic selection for trigger.

18 Claims, 8 Drawing Sheets

(58) Field of Classification Search
CPC .. G01R 13/345; G01R 29/0892; G01R 13/00; G01R 13/28; G01R 21/06; G01R 23/02; G01R 31/3177; G01R 23/16; G01R 1/025; G01R 13/32; G01R 19/00; G01R 27/28; G01R 31/318371; G01R 13/20; G01R 13/325; G01R 35/002; G06F 13/4068; G06F 13/4282; G06F 13/385; G06F 13/426; G06F 8/34; G06F 3/0483; G06F 3/05; G06F 17/00; H04L 12/40; H04L 43/10; H04L 12/40182; H04L 41/14

See application file for complete search history.

(56) References Cited

U.S. PATENT DOCUMENTS

| | | | | |
|---|---|---|---|---|
| 6,026,350 | A * | 2/2000 | Tustin | G01R 31/3177 714/E11.155 |
| 6,621,913 | B1 | 9/2003 | de Vries | |
| 6,892,150 | B2 * | 5/2005 | Pickerd | G01R 13/0254 702/69 |
| 7,013,430 | B2 * | 3/2006 | Jaffe | G01R 13/02 702/68 |
| 9,268,321 | B2 * | 2/2016 | Lehane | G04F 10/005 |
| 10,235,339 | B2 * | 3/2019 | Lehane | G06F 17/00 |
| 10,365,300 | B2 * | 7/2019 | Knierim | G01R 13/0254 |
| 10,547,490 | B1 * | 1/2020 | Lagler | H04L 27/3863 |
| 10,656,183 | B2 * | 5/2020 | Kelly | G01R 13/32 |
| 11,016,123 | B2 * | 5/2021 | Lehane | H04L 69/12 |
| 2017/0168093 | A1 * | 6/2017 | Huber | G01R 13/34 |

FOREIGN PATENT DOCUMENTS

| | | |
|---|---|---|
| CN | 101013142 A | 8/2007 |
| CN | 201110865 Y | 9/2008 |
| CN | 101859395 A | 10/2010 |
| CN | 101937019 A | 1/2011 |
| CN | 102053184 A | 5/2011 |
| CN | 102053187 A | 5/2011 |
| CN | 103713171 A | 4/2014 |
| CN | 110763888 A | 2/2020 |
| EP | 3182140 A1 | 6/2017 |
| IN | 105608040 A | 5/2016 |
| JP | H02263166 A | 10/1990 |
| JP | H08178964 A | 7/1996 |
| JP | 2011242388 A | 12/2011 |

OTHER PUBLICATIONS

Second Office Action issued by the China National Intellectual Property Administration in connection with Chinese Application No. 201911118740.4, dated Jun. 18, 2021 with English-language translation.

First Office Action issued by the China National Intellectual Property Administration in connection with Chinese Application No. 201911118740.4, dated Feb. 2, 2021, with English-language translation.

Written Opinion of the International Searching Authority issued by the China National Intellectual Property Administration (ISA/CN) in connection with International Application No. PCT/CN2020/093159, dated Aug. 20, 2020, with English-language translation.

Master Dissertation, "Design and Implementation of Multi-Channel Data Acquisition System", Univ. of Electronic Science and Technology of China, pp. 1-68, Nov. 2009, with English-language abstract.

International Search Report issued by the China National Intellectual Property Administration (ISA/CN) in connection with International Application No. PCT/CN2020/093159, dated Aug. 20, 2020, with English-language translation.

Japanese Office Action issued by the Japanese Patent Office in connection with Japanese Patent Application No. 2022-528126, dated Oct. 18, 2022. (English Translation Attached).

* cited by examiner

AUTOMATIC TRIGGER TYPE IDENTIFICATION METHOD, DEVICE, AND OSCILLOSCOPE

CROSS-REFERENCE TO RELATED APPLICATIONS

This is a National Stage Application filed under 35 U.S.C. 371 based on International Patent Application No. PCT/CN2020/093159, filed on May 29, 2020, which claims priority to Chinese Patent Application No. 201911118740.4 filed on Nov. 15, 2019, the disclosures of both of which are incorporated herein by reference in their entireties.

TECHNICAL FIELD

The present application relates to the field of oscilloscope technologies, for example, an automatic trigger type identification method and device and an oscilloscope.

BACKGROUND

The trigger of the oscilloscope refers to that when a certain waveform in the sampled data stream of the oscilloscope satisfies a condition set by the user according to requirements, the oscilloscope captures the waveform and adjacent parts of the waveform in real time. The condition set by the user is referred to as a trigger condition. The effect of the trigger is to capture the event of interest and display the waveform stably. The oscilloscope have various trigger types, and the parameter setting process is also complicated, which makes users who are unfamiliar with the oscilloscope or have no operation experience unable to reasonably select the trigger types according to characteristics of signals, resulting in more time-consuming signal debugging.

Current oscilloscopes have an AUTO (automatic trigger) function. The AUTO function refers to that the user manually presses an "auto" key of the oscilloscope, then the oscilloscope automatically adjusts the horizontal scale and the vertical scale according to the amplitude and frequency of a current signal so that the waveform can spread the whole screen as far as possible in the vertical direction and display one or two periods in the horizontal direction, and at the same time, sets the trigger type as the edge trigger, finally achieving a relatively good observation effect. For some signals, the more suitable trigger type is not the edge trigger, however, the AUTO function in the related art can only identify and configure the trigger type of the edge trigger. Therefore, a new trigger type identification method is urgently needed.

SUMMARY

The present application provides an automatic trigger type identification method and device and an oscilloscope, through which a trigger type capable of stably triggering a to-be-triggered signal can be obtained according to a preset rule for user selection or automatic selection for trigger.

In a first aspect, the present application provides an automatic trigger type identification method.

The method includes steps described below.

A to-be-triggered signal is acquired.

Characteristic parameter data of the to-be-triggered signal is calculated in real time, where the characteristic parameter data includes at least one of bus protocol matching information or variation information of at least one characteristic parameter.

A trigger type capable of stably triggering the to-be-triggered signal is determined according to the characteristic parameter data.

In a second aspect, the present application provides an oscilloscope including a memory and a processor, where the memory is configured to store a program, and the processor is configured to execute the program to implement any automatic trigger type identification method of the first aspect.

DETAILED DESCRIPTION

According to an automatic trigger type identification method provided by the present application, waveform data sampled by an analog to digital converter (ADC) is analyzed in real time, that is, characteristic parameter data, of a to-be-triggered signal, such as at least one of bus protocol matching information or variation information of at least one characteristic parameter, is obtained by analysis and calculation, and then a trigger type capable of stably triggering the to-be-triggered signal is determined according to the characteristic parameter data of the to-be-triggered signal obtained by analysis, so that the to-be-triggered signal can be better observed and tested.

Figure 1:
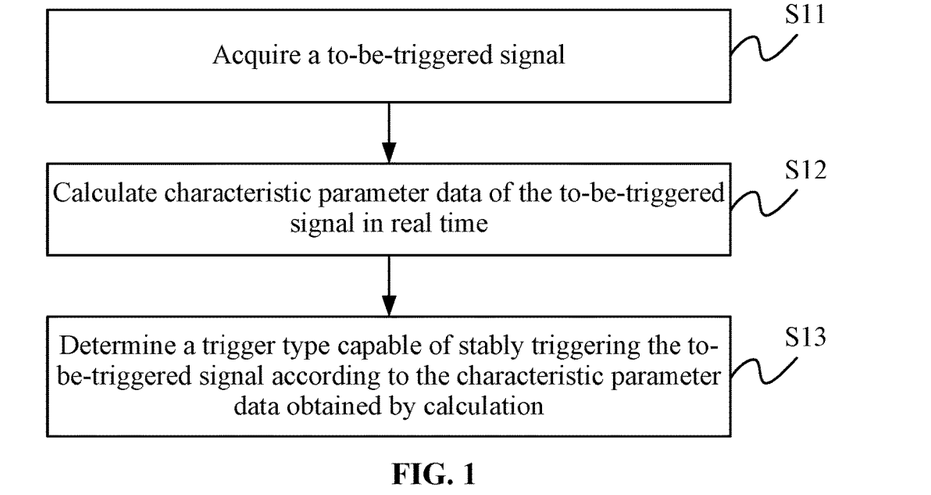
FIG. 1 is a flowchart of an automatic trigger type identification method according to an embodiment of the present application.

Referring to FIG. 1, FIG. 1 is a flowchart of an automatic trigger type identification method according to an embodiment of the present application. The method includes steps S11 to S13.

In step S11, a to-be-triggered signal is acquired.

Step S11 is executed to acquire the to-be-triggered signal output by the ADC of the oscilloscope. An analog front-end of the oscilloscope performs amplification or attenuation preprocessing on an original analog signal, and then the analog signal is converted into a digital signal to output through acquisition, quantization and encoding by the high-speed ADC.

In step S12, characteristic parameter data of the to-be-triggered signal is calculated in real time.

The characteristic parameter data includes at least one of bus protocol matching information or variation information of at least one characteristic parameter. In the present application, the variation information of the characteristic parameter includes, but is not limited to, peak-to-peak value variation information, edge slope variation information, frequency variation information, pulse width variation information and envelope variation information. The line of all maximum values and the line of all minimum values of the to-be-triggered signal is an envelope signal of the to-be-triggered signal. The bus protocol matching information is the information identified, by the analysis of information such as a data format of the to-be-triggered signal, to determine which type of bus protocol is matched. The to-be-triggered signal matching the bus protocol represents that the to-be-triggered signal is transmitted by the bus corresponding to the bus protocol. The characteristic parameter data of the to-be-triggered signal is analyzed and calculated so as to subsequently select a relatively suitable trigger type for trigger.

In step S13, a trigger type capable of stably triggering the to-be-triggered signal is determined according to the characteristic parameter data obtained by calculation. Multiple trigger types capable of stably triggering the to-be-triggered signal may be determined. After the multiple trigger types capable of stably triggering the to-be-triggered signal are determined, all the determined trigger types capable of stably triggering the to-be-triggered signal may be directly displayed for the user to select. Alternatively, a sequential order of various trigger types is preset, so that after the multiple trigger types capable of stably triggering the to-be-triggered signal are determined, the trigger type ranking first is selected to trigger the to-be-triggered signal from all the trigger types capable of stably triggering the to-be-triggered signal according to the sequential order of the various trigger types. It is to be noted that the sequential order of the various trigger types may be a pre-designed fixed order which cannot be modified by the user; or a configuration system may be set for the user to set the sequential order of the various trigger types; or the determined trigger types may be automatically ordered according to their trigger effects based on the features of the to-be-triggered signal.

In an embodiment, multiple trigger types are determined, and after the multiple trigger types capable of stably triggering the to-be-triggered signal are determined according to the characteristic parameter data, the method further includes the step described below.

At least one trigger type of the multiple trigger types capable of stably triggering the to-be-triggered signal is displayed.

In an embodiment, multiple trigger types are determined, and after the multiple trigger types capable of stably triggering the to-be-triggered signal are determined according to the characteristic parameter data, the method further includes the step described below.

One trigger type is selected from the multiple trigger types to trigger the to-be-triggered signal.

At least one piece of characteristic parameter data of the to-be-triggered signal may be calculated. In an embodiment, the characteristic parameter data of the to-be-triggered signal obtained by calculation includes at least one of bus protocol matching information or variation information of at least one characteristic parameter. The variation information of the at least one characteristic parameter includes at least one of peak-to-peak value variation information, edge slope variation information, frequency variation information, pulse width variation information or envelope variation information. Overall analysis is performed through multiple characteristic parameter data, so that the trigger type capable of triggering the to-be-triggered signal can be obtained by more accurate and comprehensive analysis.

Processes of calculating various characteristic parameter data are described below in detail.

Figure 7:
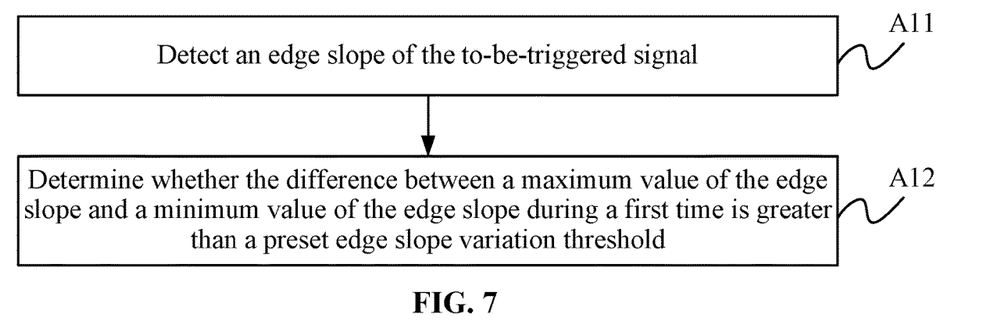
FIG. 7 is a flowchart of calculating the edge slope variation information of the to-be-triggered signal according to an embodiment of the present application.

(1) Referring to FIG. 7, FIG. 7 is a flowchart of calculating the edge slope variation information of the to-be-triggered signal. The process of calculating the edge slope variation information of the to-be-triggered signal includes steps A11 to A12.

In step A11, an edge slope of the to-be-triggered signal is detected. The edge slope includes a rising edge slope and a falling edge slope.

Figure 8:
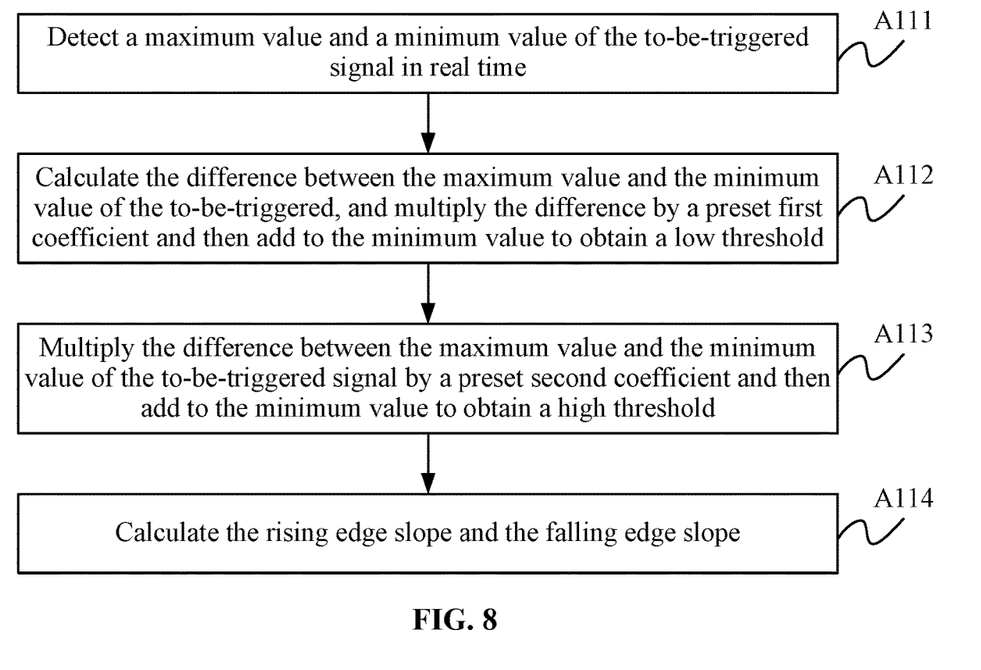
FIG. 8 is a flowchart of detecting the edge slope of the to-be-triggered signal according to an embodiment of the present application.

Referring to FIG. 8, FIG. 8 is a flowchart of detecting the edge slope of the to-be-triggered signal.

In an embodiment, the process of detecting the edge slope of the to-be-triggered signal includes steps described below.

Figure 2:
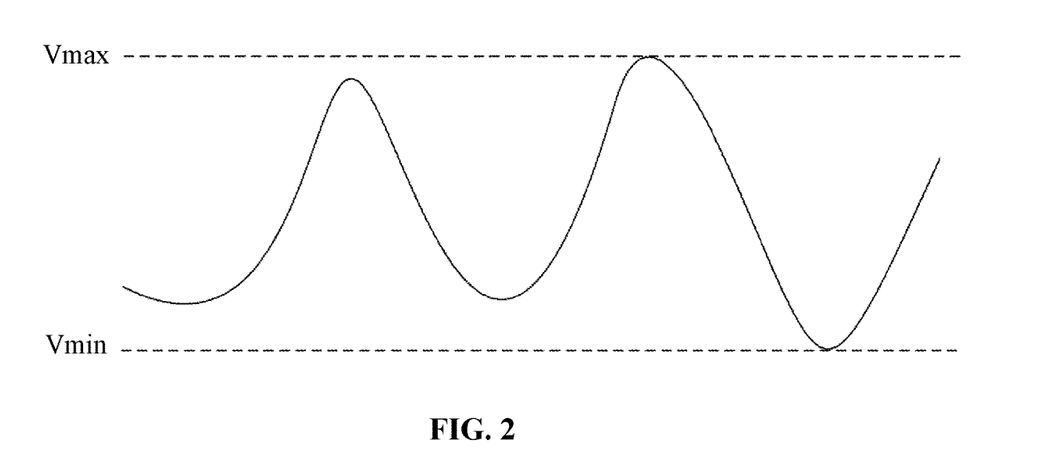
FIG. 2 is a diagram showing a maximum value and a minimum value of a to-be-triggered signal according to an embodiment of the present application.

In step A111, a maximum value and a minimum value of the to-be-triggered signal are detected in real time. In a case where it is detected that the maximum value and the minimum value do not greatly vary during a first preset time, the currently recorded maximum value and minimum value, that is, the maximum value and the minimum value of the current to-be-triggered signal, are determined and respectively denoted as $V_{max}$ and $V_{min}$. Referring to FIG. 2, FIG. 2 is a diagram showing the maximum value $V_{max}$ and the minimum value $V_{min}$ of the to-be-triggered signal. A reasonable threshold and vertical scale may be set through the $V_{max}$ and the $V_{min}$.

Exemplarily, in the process of finding the maximum value and the minimum value of the to-be-triggered signal, the current maximum value and minimum value are latched, and the latched maximum value and minimum value are respectively compared with a newly identified maximum value and minimum value. In a case where the difference between the newly identified maximum value and the latched maximum value is greater than a preset first threshold, the latched maximum value is replaced with the newly identified maximum value; in a case where the difference between the latched minimum value and the newly identified minimum value is greater than a preset second threshold, the latched minimum value is replaced with the newly identified minimum value. The first preset time may be 100 ms or even 1 s. During the first preset time, for example, 100 ms or 1 s, in a case where neither the latched maximum value nor the latched minimum value varies, the current latched values are determined as the maximum value and the minimum value of the to-be-triggered signal.

It is to be noted that the sampling is real-time and uninterrupted in practice, and therefore the detection of the maximum value and the minimum value of the to-be-triggered signal is also real-time and uninterrupted.

The process of calculating the peak-to-peak value variation information is as follows. A maximum value and a minimum value of the peak-to-peak value of the to-be-triggered signal are calculated, and whether the difference between the maximum value and the minimum value of the peak-to-peak value is greater than a preset peak-to-peak value variation threshold is determined. The process of detecting the maximum value and the minimum value of the peak-to-peak value is similar with the process of detecting the maximum value and the minimum value of the to-be-triggered signal, which is not repeated in the embodiment.

In step A112, the difference between the maximum value and the minimum value of the to-be-triggered signal is calculated, and the difference is multiplied by a preset first coefficient and then added to the minimum value to obtain a low threshold.

The first coefficient is greater than 0 and less than 1.

In step A113, the difference between the maximum value and the minimum value of the to-be-triggered signal is multiplied by a preset second coefficient and then added to the minimum value to obtain a high threshold.

The second coefficient is greater than the first coefficient and less than 1. Exemplarily, the first coefficient is 0.2, and the second coefficient is 0.8. The low threshold $V_{cmpl}$ satisfies that $V_{cmpl}=V_{min}+0.2*(V_{max}-V_{min})$. The high threshold $V_{cmph}$ satisfies that $V_{cmph}=V_{min}+0.8*(V_{max}-V_{min})$.

In step A114, the rising edge slope and the falling edge slope are calculated.

Figure 3:
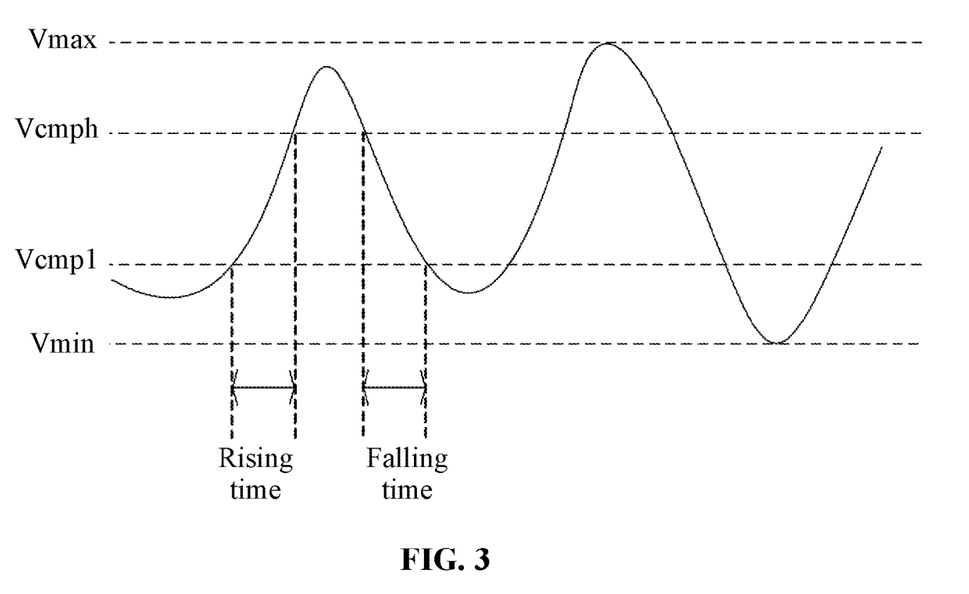
FIG. 3 is a diagram showing a rising time and a falling time according to an embodiment of the present application.

Referring to FIG. 3, a corresponding time of the rising edge stage from the low threshold $V_{cmpl}$ to the high threshold $V_{cmph}$ is recorded as a rising time Th, and the corresponding rising edge slope=$(V_{cmph}-V_{cmpl})$/Th. A corresponding time of the falling edge stage from the high threshold $V_{cmph}$ to the low threshold $V_{cmpl}$ is recorded as a falling time Tl, and the corresponding falling edge slope=$(V_{cmph}-V_{cmpl})$/Tl. It is to be noted that the calculation of the rising edge slope and the falling edge slope is also performed in real time and uninterruptedly.

In step A12, whether the difference between a maximum value of the edge slope and a minimum value of the edge slope during a first time is greater than a preset edge slope variation threshold is determined, where the edge slope variation threshold includes a rising edge slope variation threshold and a falling edge slope variation threshold.

Exemplarily, the difference between a maximum value and a minimum value of the rising edge slope is calculated, and the difference between a maximum value and a minimum value of the falling edge slope is calculated. The process of detecting the maximum value and the minimum value of the rising edge slope or the maximum value and the minimum value of the falling edge slope is similar with the process of detecting the maximum value and the minimum value of the to-be-triggered signal, which is not repeated in the embodiment.

Whether the difference between the maximum value and the minimum value of the rising edge slope during the first time is greater than a preset rising edge slope variation threshold is determined. Whether the difference between the maximum value and the minimum value of the falling edge slope during a period of time is greater than a preset falling edge slope variation threshold is determined.

Figure 9:
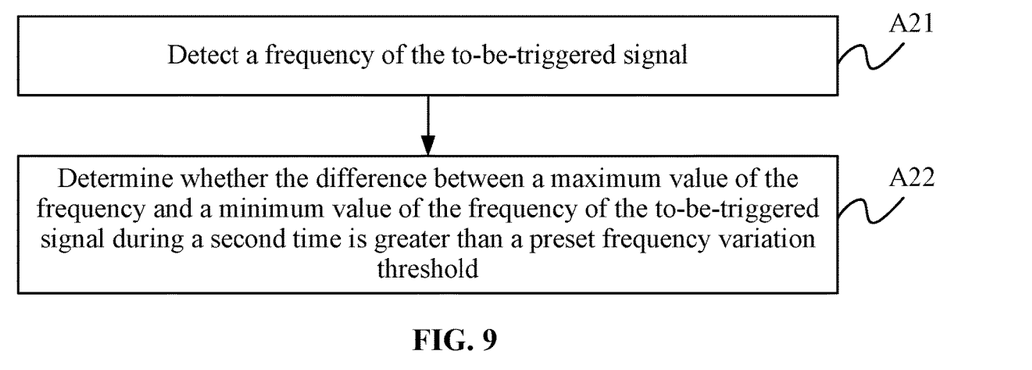
FIG. 9 is a flowchart of calculating the frequency variation information of the to-be-triggered signal according to an embodiment of the present application.

(2) Referring to FIG. 9, FIG. 9 is a flowchart of calculating the frequency variation information of the to-be-triggered signal. The process of calculating the frequency variation information of the to-be-triggered signal includes steps A21 to A22.

In step A21, a frequency of the to-be-triggered signal is detected.

The frequency of the to-be-triggered signal may be calculated by the frequency measurement method or the period measurement method. Exemplarily, during a second preset time, the number of rising edges of the to-be-triggered signal is detected, and in a case where the number of rising edges greater than or equal to 2, the frequency of the to-be-triggered signal is calculated by the frequency measurement method; in a case where the number of rising edges is 0 or 1, the frequency of the to-be-triggered signal is calculated by the period measurement method.

In step A22, whether the difference between a maximum value of the frequency and a minimum value of the frequency of the to-be-triggered signal during a second time is greater than a preset frequency variation threshold is determined.

During the second time, if the difference between the maximum value of the frequency and the minimum value of the frequency of the to-be-triggered signal is less than or equal to the preset frequency variation threshold, it is determined that the frequency of the to-be-triggered signal does not vary.

Figure 10:
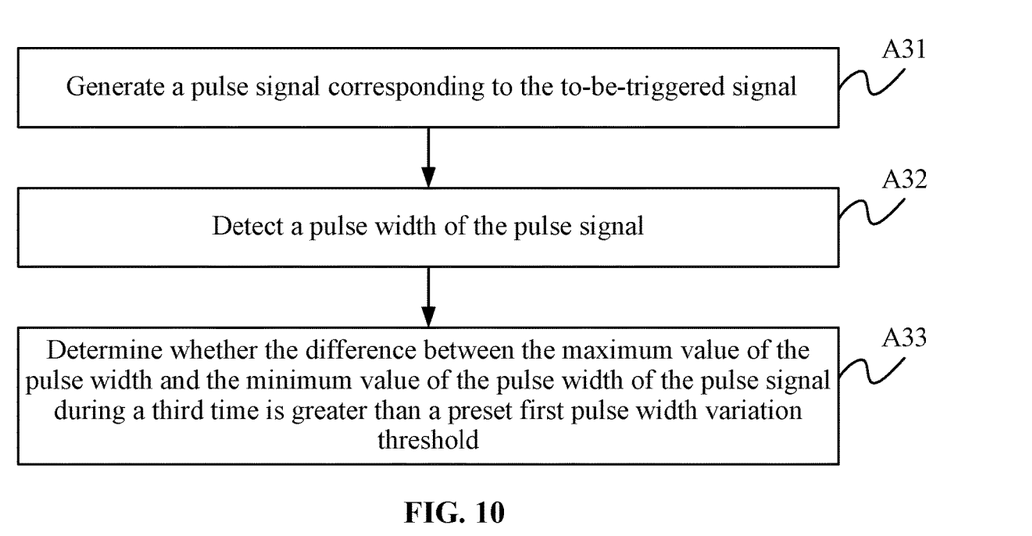
FIG. 10 is a flowchart of calculating the pulse width variation information of the to-be-triggered signal according to an embodiment of the present application.

(3) Referring to FIG. 10, FIG. 10 is a flowchart of calculating the pulse width variation information of the to-be-triggered signal. The process of calculating the pulse width variation information of the to-be-triggered signal includes steps A31 to A33.

In step A31, a pulse signal corresponding to the to-be-triggered signal is generated.

Figure 11:
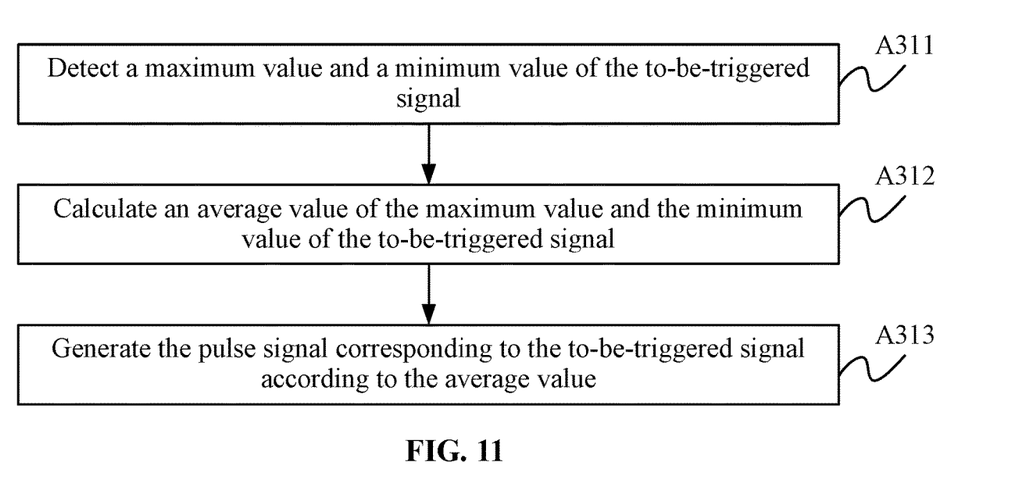
FIG. 11 is a flowchart of generating the pulse signal corresponding to the to-be-triggered signal according to an embodiment of the present application.

Referring to FIG. 11, FIG. 11 is a flowchart of generating the pulse signal corresponding to the to-be-triggered signal. In an embodiment, the process of generating the pulse signal corresponding to the to-be-triggered signal includes steps described below.

In step A311, a maximum value and a minimum value of the to-be-triggered signal are detected.

Step A311 is identical to step A111 and is not repeated in the embodiment.

In step A312, an average value of the maximum value and the minimum value of the to-be-triggered signal is calculated.

The average value $V_{cmp}$ of the maximum value and the minimum value of the to-be-triggered signal satisfies that $V_{cmp}=0.5*(V_{max}+V_{min})$. The average value $V_{cmp}$ represents the middle position of the waveform of the to-be-triggered signal.

In step A313, the pulse signal corresponding to the to-be-triggered signal is generated according to the average value.

The average value $V_{cmp}$ is taken as a threshold level, and a binary signal, that is, the pulse signal, corresponding to the to-be-triggered signal is generated according to the threshold level.

Figure 4:
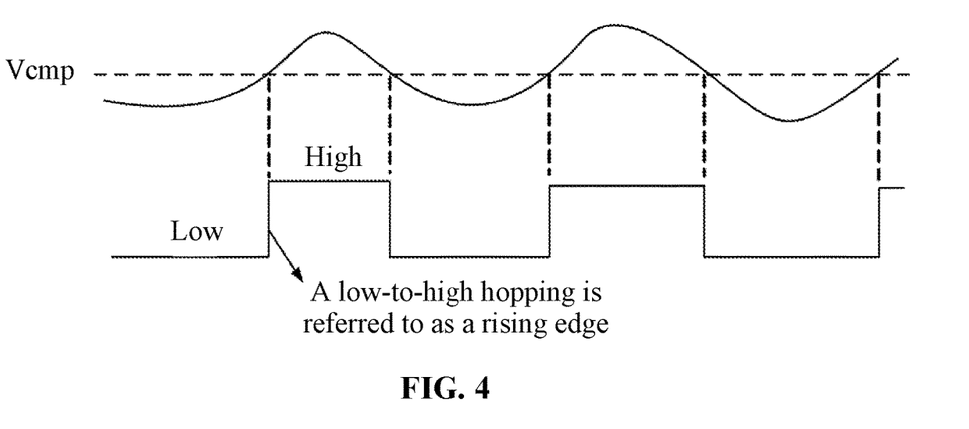
FIG. 4 is a diagram showing a pulse signal and a to-be-triggered signal according to an embodiment of the present application.

Exemplarily, referring to FIG. 4, it is determined that a point in the to-be-triggered signal which is greater than the average value corresponds to a high level, and it is determined that a point in the to-be-triggered signal which is less than the average value corresponds to a low level, thereby the corresponding pulse signal is generated.

In step A32, a pulse width of the pulse signal is detected.

Exemplarily, a maximum value of the pulse width and a minimum value of the pulse width of the to-be-triggered signal are detected according to the generated pulse signal.

In step A33, whether the difference between the maximum value of the pulse width and the minimum value of the pulse width of the pulse signal during a third time is greater than a preset first pulse width variation threshold is determined.

In a case where the to-be-triggered signal is a periodic signal, the maximum value of the pulse width and the minimum value of the pulse width during the third time are equal to each other or have a very small difference; in a case where the to-be-triggered signal is an aperiodic signal, the maximum value of the pulse width and the minimum value of the pulse width during a period of time have a large difference. Through this feature, whether the to-be-triggered signal is a periodic signal is analyzed.

Figure 12:
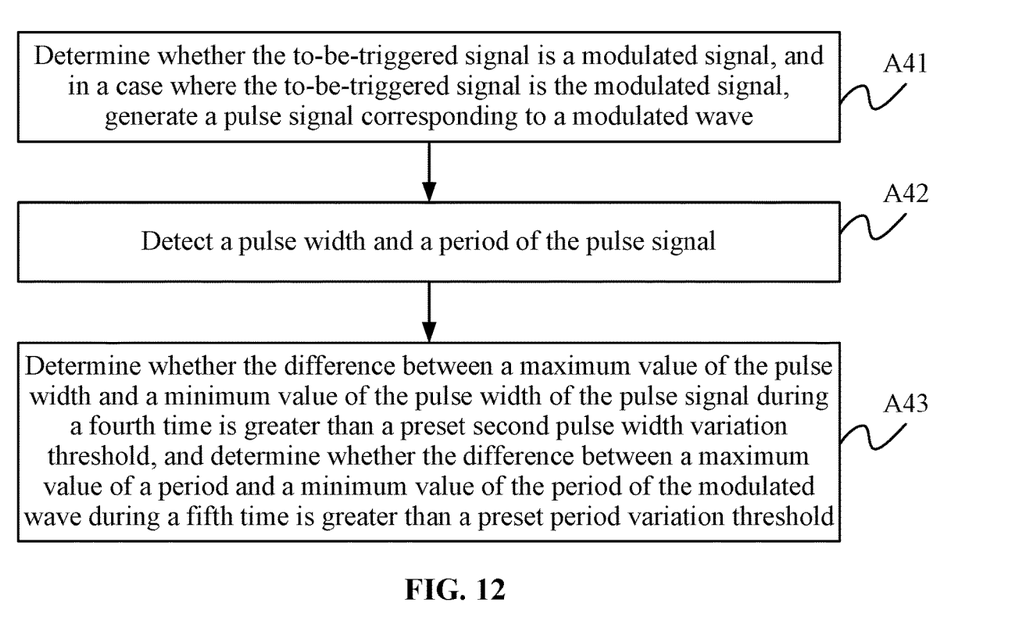
FIG. 12 is a flowchart of calculating the envelope variation information of the to-be-triggered signal according to an embodiment of the present application.

(4) Referring to FIG. 12, FIG. 12 is a flowchart of calculating the envelope variation information of the to-be-triggered signal. The process of calculating the envelope variation information of the to-be-triggered signal includes steps A41 to A43.

In step A41, whether the to-be-triggered signal is a modulated signal is determined, and in a case where the to-be-triggered signal is the modulated signal, a pulse signal corresponding to a modulated wave is generated.

In an embodiment, a variation value of the maximum value of the to-be-triggered signal and a variation value of the minimum value of the to-be-triggered signal during a period of time are detected, and in a case where the variation value of the maximum value is greater than a preset variation threshold or the variation value of the minimum value is greater than the preset variation threshold, it is determined that the to-be-triggered signal is an amplitude modulation (AM) modulated signal. Grouping is performed according to the period time width of the to-be-triggered signal, and a maximum value and a minimum value in a group is searched for. All the maximum values are connected and all the minimum values are connected, and the obtained upper and lower waveforms are the envelope signal, that is, the modulated wave, of the to-be-triggered signal. The peak-to-peak value of the modulated wave is calculated, a comparison threshold level is set according to the peak-to-peak value, and the comparison threshold level is ensured to be located at the middle position of the amplitude of the modulated wave, so as to obtain the pulse signal corresponding to the modulated wave.

In step A42, a pulse width and a period of the pulse signal are detected.

Based on the pulse signal corresponding to the modulated wave, the time detected between two adjacent rising edges is the period of the modulated wave, the time between a rising edge and a next adjacent falling edge is detected to obtain a positive pulse width, and the time between a falling edge and a next adjacent rising edge is detected to obtain a negative pulse width. The pulse width of the pulse signal detected in the embodiment refers to the positive pulse width.

In step A43, whether the difference between a maximum value of the pulse width and a minimum value of the pulse width of the pulse signal during a fourth time is greater than a preset second pulse width variation threshold is determined, and whether the difference between a maximum value of a period and a minimum value of the period of the modulated wave during a fifth time is greater than a preset period variation threshold is determined.

Figure 13:
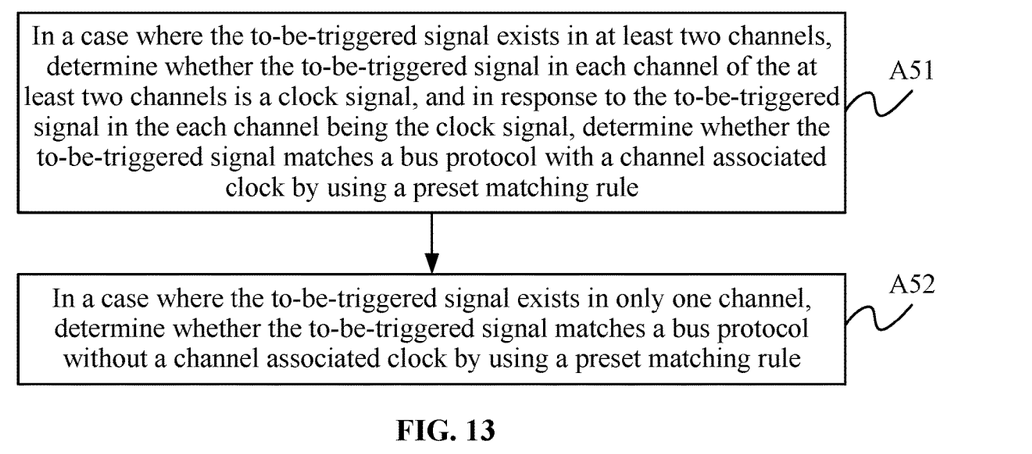
FIG. 13 is a flowchart of calculating the bus protocol matching information of the to-be-triggered signal according to an embodiment of the present application.

(5) Referring to FIG. 13, FIG. 13 is a flowchart of calculating the bus protocol matching information of the to-be-triggered signal. The process of calculating the bus protocol matching information of the to-be-triggered signal includes steps A51 to A52.

In step A51, in a case where the to-be-triggered signal exists in at least two channels, whether the to-be-triggered signal in each channel of the at least two channels is a clock signal is determined, and in response to the to-be-triggered signal in the each channel being the clock signal, whether the to-be-triggered signal matches a bus protocol with a channel associated clock is determined by using a preset matching rule.

In the embodiment, buses themselves with a clock are classified into one type, such as the Serial Peripheral Interface (SPI) and the Inter-Integrated Circuit (IIC) bus. With regard to the IIC bus, whether the to-be-triggered signal satisfies a start condition, an end condition and a data transmission format of the IIC, whether a clock bus and a data bus are at a high level in an idle state, and whether the amount of data transmitted in a frame of data transmission is an integer multiple of 9 bits are determined. In a case where the to-be-triggered signal satisfies the start condition, the end condition and the data transmission format of the IIC, the clock bus and the data bus are at a high level in an idle state, and the amount of data transmitted in a frame of data transmission is an integer multiple of 9 bits, it is determined that the to-be-triggered signal matches the IIC bus protocol, and correspondingly, the trigger type capable of stably triggering the to-be-triggered signal is IIC bus trigger.

With regard to the SPI bus, whether the amount of data transmitted in a frame of data transmission of to-be-triggered signal is an integer multiple of 8 bits is determined. In a case where the amount of data transmitted in a frame of data transmission of to-be-triggered signal is an integer multiple of 8 bits, it is determined that the to-be-triggered signal matches the SPI bus protocol, and correspondingly, the trigger type capable of stably triggering the to-be-triggered signal is SPI bus trigger.

It is to be noted that no subsequent trigger type determination is performed for the clock signal.

In step A52, in a case where the to-be-triggered signal exists in only one channel, whether the to-be-triggered signal matches a bus protocol without a channel associated clock is determined by using a preset matching rule.

Figure 14:
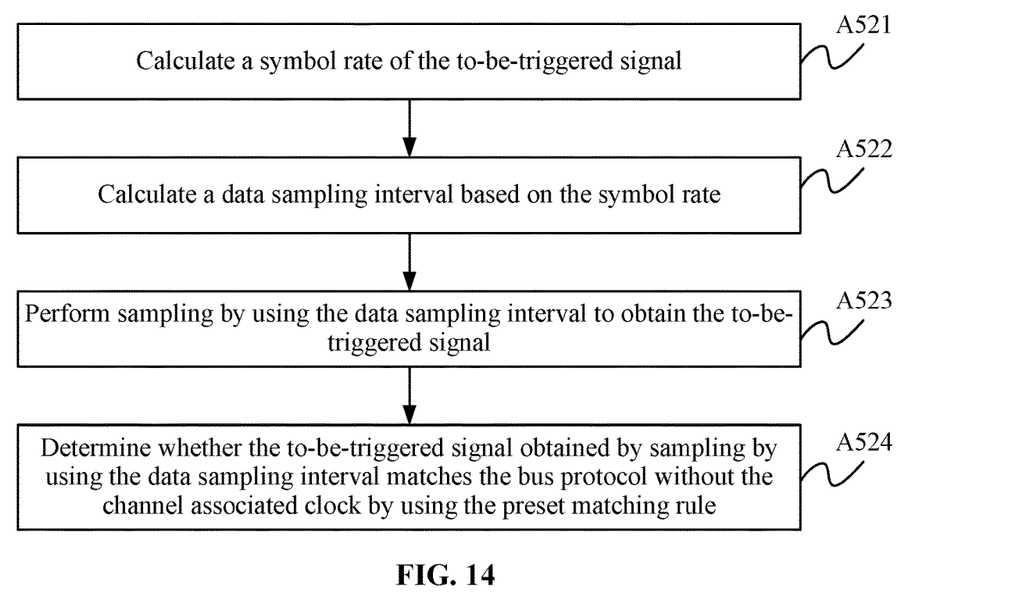
FIG. 14 is a flowchart of determining whether the to-be-triggered signal matches the bus protocol without the channel associated clock by using the preset matching rule according to an embodiment of the present application.

Referring to FIG. 14, FIG. 14 is a flowchart of determining whether the to-be-triggered signal matches the bus protocol without the channel associated clock by using the preset matching rule.

In an embodiment, the step in which whether the to-be-triggered signal matches the bus protocol without the channel associated clock is determined by using the preset matching rule includes steps described below.

In step A521, a symbol rate of the to-be-triggered signal is calculated.

Figure 5:
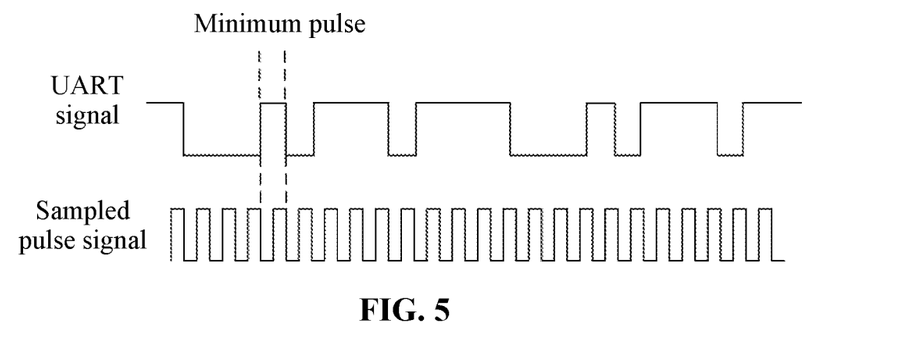
FIG. 5 is a diagram of generating a sampled pulse signal according to a minimum pulse width according to an embodiment of the present application.
Figure 6:
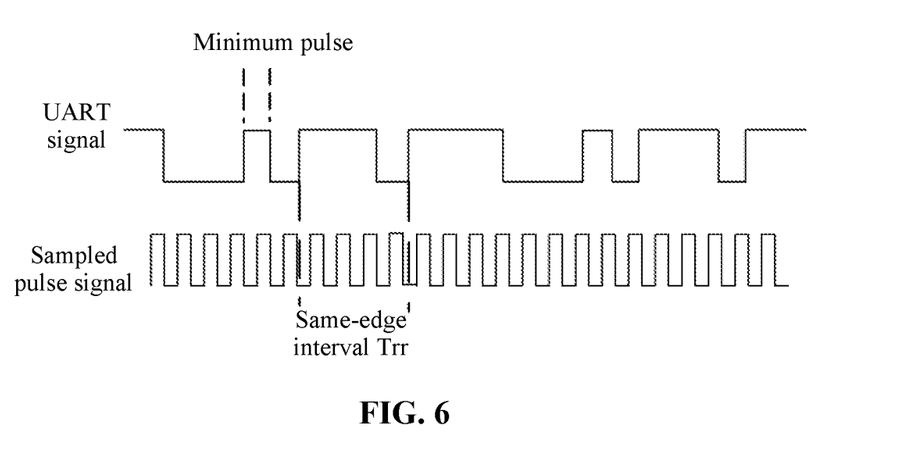
FIG. 6 is a diagram of calculating the number of sampled pulses in a same-edge interval according to an embodiment of the present application.

In the embodiment, buses themselves without a clock signal are classified into one type, such as the RS232, the Local Interconnect Network (LIN), the Controller Area Network (CAN) and the Universal Asynchronous Receiver/Transmitter (UART). The symbol rate of the to-be-triggered signal is calculated as follows. The minimum pulse width of the to-be-triggered signal is detected in real time, and a sampled pulse signal is generated according to the minimum pulse width, as shown in FIG. 5. A same-edge interval Trr is found in the to-be-triggered signal, and the number Ns of sampled pulses in this interval is recorded, as shown in FIG.

6. Then, an average value T is calculated through that T=Trr/Ns, and thus the relatively accurate symbol rate f is obtained through that f=1/T.

In step A522, a data sampling interval is calculated based on the symbol rate.

In step A523, sampling is performed by using the data sampling interval to obtain.

In step A524, whether the to-be-triggered signal obtained by sampling by using the data sampling interval matches the bus protocol without the channel associated clock is determined by using the preset matching rule.

In a case where it is determined that the to-be-triggered signal matches the RS232 bus protocol, it is determined that the trigger type capable of stably triggering the to-be-triggered signal is RS232 bus trigger. In a case where it is determined that the to-be-triggered signal matches the LIN bus protocol, it is determined that the trigger type capable of stably triggering the to-be-triggered signal is LIN bus trigger. In a case where it is determined that the to-be-triggered signal matches the CAN bus protocol, it is determined that the trigger type capable of stably triggering the to-be-triggered signal is CAN bus trigger.

The idle level of the RS232 bus is a low level, and the idle level of the UART bus is a high level. The duration of the idle level is relatively long, so that which bus protocol is matched may be determined by determining the pulse polarity of a maximum width. Exemplarily, if the pulse polarity of the maximum width is the negative polarity, the RS232 bus protocol is matched. The data format of the bus is start bits+data (optionally, parity bits) bits+end bits, and the number of data bits of the start bits+data (optionally, parity bits) bits+end bits between two idle levels is counted. In a case where the number of data bits is less than or equal to 10, it is determined that the RS232 bus protocol and the UART bus protocol may be matched; and in a case where the number of data bits is greater than 10, it is determined that neither the RS232 bus protocol nor the UART bus protocol is matched.

The step in which the trigger type capable of stably triggering the to-be-triggered signal is determined according to the characteristic parameter data includes the step described below. The trigger type capable of stably triggering the to-be-triggered signal is determined according to different information included in the characteristic parameter data. In an embodiment, the characteristic parameter data of the to-be-triggered signal obtained by calculation includes the peak-to-peak value variation information, the edge slope variation information, the frequency variation information, the pulse width variation information and the envelope variation information. According to these characteristic parameter data, the process of determining the trigger type capable of stably triggering the to-be-triggered signal may be as follows.

1. In a case where the frequency variation information is that the difference between the maximum value and the minimum value of the frequency is less than or equal to the preset frequency variation threshold, the peak-to-peak value variation information is that the difference between the maximum value and the minimum value of the peak-to-peak value is less than or equal to the preset peak-to-peak value variation threshold, and the edge slope variation information is that the difference between the maximum value and the minimum value of the rising edge slope is less than or equal to the preset rising edge slope variation threshold, and that the difference between the maximum value and the minimum value of the falling edge slope is less than or equal to the preset falling edge slope variation threshold, it is determined that the to-be-triggered signal is a single periodic signal, and it is determined that the trigger type capable of stably triggering the to-be-triggered signal is edge trigger.

2. In a case where the frequency variation information is that the difference between the maximum value and the minimum value of the frequency is less than or equal to the preset frequency variation threshold, the peak-to-peak value variation information is that the difference between the maximum value and the minimum value of the peak-to-peak value is less than or equal to the preset peak-to-peak value variation threshold, and the edge slope variation information is at least one of that the difference between the maximum value and the minimum value of the rising edge slope is greater than the preset rising edge slope variation threshold, or that the difference between the maximum value and the minimum value of the falling edge slope is greater than the preset falling edge slope variation threshold, it is determined that the trigger types capable of stably triggering the to-be-triggered signal are the edge trigger and slope trigger, and the trigger types are displayed. At this time, the user may select the slope trigger if looking for an abnormal edge signal, and may select the edge trigger if not paying attention to slope characteristics.

3. In a case where the frequency variation information is that the difference between the maximum value and the minimum value of the frequency is greater than the preset frequency variation threshold, the peak-to-peak value variation information is that the difference between the maximum value and the minimum value of the peak-to-peak value is less than or equal to the preset peak-to-peak value variation threshold, and the edge slope variation information is at least one of that the difference between the maximum value and the minimum value of the rising edge slope is greater than the preset rising edge slope variation threshold, or that the difference between the maximum value and the minimum value of the falling edge slope is greater than the preset falling edge slope variation threshold, it is determined that the trigger types capable of stably triggering the to-be-triggered signal are the slope trigger and the edge trigger, and the trigger types are displayed. At this time, the user may select the slope trigger if looking for an abnormal edge signal; if the user does not pay attention to slope characteristics, the edge trigger is more suitable to stably triggering since the to-be-triggered signal may be a scan signal.

4. In a case where the frequency variation information is that the difference between the maximum value and the minimum value of the frequency is greater than the preset frequency variation threshold, the peak-to-peak value variation information is that the difference between the maximum value and the minimum value of the peak-to-peak value is less than or equal to the preset peak-to-peak value variation threshold, the edge slope variation information is that the difference between the maximum value and the minimum value of the rising edge slope is less than or equal to the preset rising edge slope variation threshold, and that the difference between the maximum value and the minimum value of the falling edge slope is less than or equal to the preset falling edge slope variation threshold, and the pulse width variation information is that the difference between the maximum value and the minimum value of the pulse width is greater than the preset first pulse width variation threshold, it is determined that the trigger type capable of stably triggering the to-be-triggered signal is pulse width trigger.

5. In a case where the frequency variation information is that the difference between the maximum value and the minimum value of the frequency is greater than the preset frequency variation threshold, the peak-to-peak value variation information is that the difference between the maximum value and the minimum value of the peak-to-peak value is less than or equal to the preset peak-to-peak value variation threshold, the edge slope variation information is that the difference between the maximum value and the minimum value of the rising edge slope is less than or equal to the preset rising edge slope variation threshold, and that the difference between the maximum value and the minimum value of the falling edge slope is less than or equal to the preset falling edge slope variation threshold, and the to-be-triggered signal satisfies a burst characteristic, it is determined that the trigger types capable of stably triggering the to-be-triggered signal are timeout trigger and N-th edge trigger.

6. In a case where the frequency variation information is that the difference between the maximum value and the minimum value of the frequency is less than or equal to the preset frequency variation threshold, the peak-to-peak value variation information is that the difference between the maximum value and the minimum value of the peak-to-peak value is greater than the preset peak-to-peak value variation threshold, and the envelope variation information is that the difference between the maximum value and the minimum value of the pulse width is less than or equal to the preset second pulse width variation threshold, and that the difference between the maximum value and the minimum value of the period is less than or equal to the preset period variation threshold, it is determined that the trigger type capable of stably triggering the to-be-triggered signal is the pulse width trigger.

7. In a case where the frequency variation information is that the difference between the maximum value and the minimum value of the frequency is less than or equal to the preset frequency variation threshold, the peak-to-peak value variation information is that the difference between the maximum value and the minimum value of the peak-to-peak value is greater than the preset peak-to-peak value variation threshold, the envelope variation information is at least one of that the difference between the maximum value and the minimum value of the pulse width is greater than the preset second pulse width variation threshold, or that the difference between the maximum value and the minimum value of the period is greater than the preset period variation threshold, and if an accidental overshoot exists in the to-be-triggered signal, it is determined that the trigger type capable of stably triggering the to-be-triggered signal is over-amplitude trigger; and if an accidental under amplitude exists in the to-be-triggered signal, it is determined that the trigger type capable of stably triggering the to-be-triggered signal is under-amplitude trigger.

8. In a case where the frequency variation information is that the difference between the maximum value and the minimum value of the frequency is greater than the preset frequency variation threshold, and the peak-to-peak value variation information is that the difference between the maximum value and the minimum value of the peak-to-peak value is greater than the preset peak-to-peak value variation threshold, it is determined that the trigger type capable of stably triggering the to-be-triggered signal is the edge trigger.

For simple description, the preceding various method embodiments are all expressed as a series of action combinations. However, those skilled in the art should understand that the present application is not limited by the described action order, and according to the present application, some steps may be performed in another order or concurrently.

A device embodiment of the present application is described below and may be used for executing the method embodiments of the present application. For details not disclosed in the device embodiment of the present application, reference may be made to the method embodiments of the present application.

Figure 15:
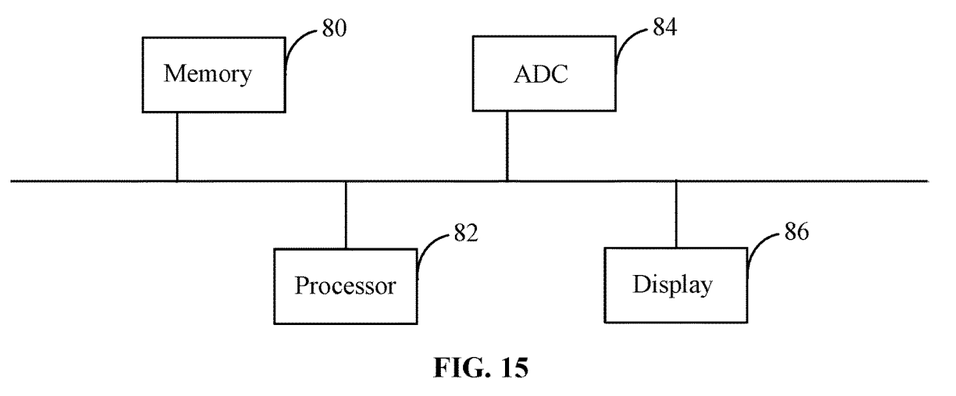
FIG. 15 is a schematic diagram of an oscilloscope structure according to an embodiment of the present application.

Referring to FIG. 15, FIG. 15 is a schematic diagram of an oscilloscope structure according to an embodiment of the present application. The embodiment provides an oscilloscope including a memory (80) and a processor (82). The memory is configured to store a program, and the processor may call the program stored in the memory. In aspects, the oscilloscope may further include an analog-to-digital converter (ADC) (84) and a display (86). The program is used for executing steps described below.

A to-be-triggered signal is acquired.

Characteristic parameter data of the to-be-triggered signal is calculated in real time, where the characteristic parameter data includes at least one of bus protocol matching information or variation information of at least one characteristic parameter.

A trigger type capable of stably triggering the to-be-triggered signal is determined according to the characteristic parameter data.

For the refinement and extension functions of the program, reference may be made to the preceding description.

The hardware structure of the oscilloscope may include at least one processor, at least one memory and at least one communication bus. The communication between the processor and the memory is completed via the communication bus.

In some embodiments, the processor may be a central processing unit (CPU), an application specific integrated circuit (ASIC), or at least one integrated circuit configured to implement the embodiments of the present application, etc.

The memory includes at least one type of readable storage medium. The readable storage medium may be a non-volatile memory (NVM) such as a flash memory, a hard disk, a Multimedia Card, a memory card, etc. The readable storage medium may also be a high-speed random-access memory (RAM).

The oscilloscope may further include a user interface that may include at least one of an input unit (such as a keyboard), a voice input device (such as a device including a microphone and having a speech recognition function), or a voice output device (such as a sound and earphones).

Exemplarily, the user interface may further include at least one of a standard wired interface or a standard wireless interface.

The oscilloscope may further include a display, which may also be referred to as a display screen or a display unit. In some embodiments, the display may be a light-emitting diode (LED) display, a liquid crystal display, a touch-sensitive liquid crystal display, an organic light-emitting diode (OLED) display, etc. The display is configured to display waveform information and display a visual user interface.

Exemplarily, the oscilloscope further includes a touchable sensor. A region provided by the touch sensor for a user to perform a touch operation is referred to as a touch control region. In addition, the touch sensor may be a resistive touch sensor, a capacitive touch sensor, etc. The touch sensor includes not only a touch sensor of a contact type, but also a touch sensor of a proximity type, etc.

In addition, the touch sensor may be a single sensor or multiple sensors arranged, for example, in an array. The user may input information by touching the touch control region.

In addition, the area of the display of the oscilloscope may be the same as or different from the area of the touch sensor. Exemplarily, the display is stacked with the touch sensor to form a touch display screen. The device detects a touch control operation triggered by the user based on the touch display screen.

The device embodiment described above is merely illustrative, the units described as separate components may or may not be physically separated, and components presented as units may or may not be physical units. Part or all of these modules may be selected according to practical requirements to achieve the object of the solution of the embodiment. Those of ordinary skill in the art can achieve understanding and implementation without creative work.

As used herein, relationship terms such as "first" and "second" are used merely to distinguish one entity or operation from another without necessarily requiring or implying any such actual relationship or order between these entities or operations. Furthermore, the terms "comprising", "including" or any other variant thereof are intended to encompass a non-exclusive inclusion so that a process, method, article or device that includes a series of elements not only includes the expressly listed elements but may also include other elements that are not expressly listed or are inherent to such process, method, article or device. In the absence of more restrictions, the elements defined by the statement "including a . . . " do not exclude the presence of additional identical elements in the process, method, article or device that includes the elements.

The preceding technical solutions provide the automatic trigger type identification method and device and an oscilloscope. The method includes analyzing characteristic parameter data of a to-be-triggered signal, where the characteristic parameter data includes at least one of bus protocol matching information or variation information of at least one characteristic parameter. In this way, a trigger type capable of stably triggering the to-be-triggered signal is obtained for user selection or automatic selection for trigger. According to the trigger type identification method provided in the present application, a trigger type relatively suitable to a current to-be-triggered signal can be identified according to at least one of bus protocol matching information or variation information of at least one characteristic parameter of the to-be-triggered signal, and therefore the to-be-triggered signal can be better observed and tested.

What is claimed is:

1. An automatic trigger type identification computer-implemented method, comprising:
   acquiring a to-be-triggered signal from an analog-to-digital converter (ADC) of the oscilloscope;
   calculating characteristic parameter data of the to-be-triggered signal in real time, wherein the characteristic parameter data comprises at least one of bus protocol matching information or variation information of at least one characteristic parameter;
   determining a trigger type capable of stably triggering the to-be-triggered signal according to the characteristic parameter data,
   displaying the trigger type capable of stably triggering the to-be-triggered signal; and
   causing the oscilloscope to select a trigger type to trigger the to-be-triggered signal based on the determined trigger type capable of stably triggering the to-be-triggered signal according to the characteristic parameter data.

2. The computer-implemented method according to claim 1, wherein a plurality of trigger types are determined, and wherein after determining the plurality of trigger types capable of stably triggering the to-be-triggered signal according to the characteristic parameter data, the method further comprises:
   selecting one trigger type from the plurality of trigger types to trigger the to-be-triggered signal.

3. The computer-implemented method according to claim 1, wherein the variation information of the at least one characteristic parameter comprises at least one of:
   peak-to-peak value variation information, edge slope variation information, frequency variation information, pulse width variation information or envelope variation information.

4. The computer-implemented method according to claim 1, wherein the characteristic parameter data comprises edge slope variation information, and calculating the edge slope variation information of the to-be-triggered signal comprises:
   detecting an edge slope of the to-be-triggered signal, wherein the edge slope comprises a rising edge slope and a falling edge slope; and
   determining whether a difference between a maximum value of the edge slope and a minimum value of the edge slope during a first time is greater than a preset edge slope variation threshold, wherein the edge slope variation threshold comprises a rising edge slope variation threshold and a falling edge slope variation threshold.

5. The computer-implemented method according to claim 1, wherein the characteristic parameter data comprises frequency variation information, and calculating the frequency variation information of the to-be-triggered signal comprises:
   detecting a frequency of the to-be-triggered signal; and
   determining whether a difference between a maximum value of the frequency and a minimum value of the frequency of the to-be-triggered signal during a second time is greater than a preset frequency variation threshold.

6. The computer-implemented method according to claim 1, wherein the characteristic parameter data comprises pulse width variation information, and calculating the pulse width variation information of the to-be-triggered signal comprises:
   generating a pulse signal corresponding to the to-be-triggered signal;
   detecting a pulse width of the to-be-triggered signal; and
   determining whether a difference between a maximum value of the pulse width and a minimum value of the pulse width of the to-be-triggered signal during a third time is greater than a preset first pulse width variation threshold.

7. The computer-implemented method according to claim 1, wherein the characteristic parameter data comprises envelope variation information, and calculating the envelope variation information of the to-be-triggered signal comprises:
   determining whether the to-be-triggered signal is a modulated signal, and in a case where the to-be-triggered signal is the modulated signal, generating a pulse signal corresponding to a modulated wave;
   detecting a pulse width of the modulated wave and a period of the modulated wave; and
   determining whether a difference between a maximum value of the pulse width of the modulated wave and a minimum value of the pulse width of the modulated wave during a fourth time is greater than a preset second pulse width variation threshold, and determining whether a difference between a maximum value of a period of the modulated wave and a minimum value of the period of the modulated wave during a fifth time is greater than a preset period variation threshold.

8. The computer-implemented method according to claim 1, wherein the characteristic parameter data comprises the bus protocol matching information, and calculating the bus protocol matching information of the to-be-triggered signal comprises:
   in a case where the to-be-triggered signal exists in at least two channels, determining whether the to-be-triggered signal in each channel of the at least two channels is a clock signal, and in response to the to-be-triggered signal in each channel being the clock signal, determining whether the to-be-triggered signal matches a bus protocol with a channel associated clock by using a preset matching rule; and
   in a case where the to-be-triggered signal exists in only one channel, determining whether the to-be-triggered signal matches a bus protocol without a channel associated clock by using a preset matching rule.

9. The computer-implemented method according to claim 1, wherein determining the trigger type capable of stably triggering the to-be-triggered signal according to the characteristic parameter data comprises:
   determining the trigger type capable of stably triggering the to-be-triggered signal according to different information comprised in the characteristic parameter data, wherein the characteristic parameter data comprises peak-to-peak value variation information, edge slope variation information, frequency variation information, pulse width variation information and envelope variation information.

10. An oscilloscope comprising a memory and a processor, wherein the memory is configured to store a program, and the processor is configured to execute the program to implement:
   acquiring a to-be-triggered signal from an analog-to-digital converter (ADC) of the oscilloscope;
   calculating characteristic parameter data of the to-be-triggered signal in real time, wherein the characteristic parameter data comprises at least one of bus protocol matching information or variation information of at least one characteristic parameter;
   determining a trigger type capable of stably triggering the to-be-triggered signal according to the characteristic parameter data;
   displaying the trigger type capable of stably triggering the to-be-triggered signal on a display; and
   causing the oscilloscope to select a trigger type to trigger the to-be-triggered signal based on the determined trigger type capable of stably triggering the to-be-triggered signal according to the characteristic parameter data.

11. The oscilloscope according to claim 10, wherein a plurality of trigger types are determined, and wherein the processor is configured to execute the program to implement:
   selecting one trigger type from the plurality of trigger types to trigger the to-be-triggered signal.

12. The oscilloscope according to claim 10, wherein the variation information of the at least one characteristic parameter comprises at least one of:
   peak-to-peak value variation information, edge slope variation information, frequency variation information, pulse width variation information or envelope variation information.

13. The oscilloscope according to claim 10, wherein the characteristic parameter data comprises edge slope variation information, and calculating the edge slope variation information of the to-be-triggered signal comprises:
   detecting an edge slope of the to-be-triggered signal, wherein the edge slope comprises a rising edge slope and a falling edge slope; and
   determining whether a difference between a maximum value of the edge slope and a minimum value of the edge slope during a first time is greater than a preset edge slope variation threshold, wherein the edge slope variation threshold comprises a rising edge slope variation threshold and a falling edge slope variation threshold.

14. The oscilloscope according to claim 10, wherein the characteristic parameter data comprises frequency variation information, and calculating the frequency variation information of the to-be-triggered signal comprises:
   detecting a frequency of the to-be-triggered signal; and
   determining whether a difference between a maximum value of the frequency and a minimum value of the frequency of the to-be-triggered signal during a second time is greater than a preset frequency variation threshold.

15. The oscilloscope according to claim 10, wherein the characteristic parameter data comprises pulse width variation information, and calculating the pulse width variation information of the to-be-triggered signal comprises:
   generating a pulse signal corresponding to the to-be-triggered signal;
   detecting a pulse width of the to-be-triggered signal; and
   determining whether a difference between a maximum value of the pulse width and a minimum value of the pulse width of the to-be-triggered signal during a third time is greater than a preset first pulse width variation threshold.

16. The oscilloscope according to claim 10, wherein the characteristic parameter data comprises envelope variation information, and calculating the envelope variation information of the to-be-triggered signal comprises:
   determining whether the to-be-triggered signal is a modulated signal, and in a case where the to-be-triggered signal is the modulated signal, generating a pulse signal corresponding to a modulated wave;
   detecting a pulse width of the modulated wave and a period of the modulated wave; and
   determining whether a difference between a maximum value of the pulse width of the modulated wave and a minimum value of the pulse width of the modulated wave during a fourth time is greater than a preset second pulse width variation threshold, and determining whether a difference between a maximum value of a period of the modulated wave and a minimum value of the period of the modulated wave during a fifth time is greater than a preset period variation threshold.

17. The oscilloscope according to claim 10, wherein the characteristic parameter data comprises the bus protocol matching information, and calculating the bus protocol matching information of the to-be-triggered signal comprises:
  in a case where the to-be-triggered signal exists in at least two channels, determining whether the to-be-triggered signal in each channel of the at least two channels is a clock signal, and in response to the to-be-triggered signal in each channel being the clock signal, determining whether the to-be-triggered signal matches a bus protocol with a channel associated clock by using a preset matching rule; and
  in a case where the to-be-triggered signal exists in only one channel, determining whether the to-be-triggered signal matches a bus protocol without a channel associated clock by using a preset matching rule.

18. The oscilloscope according to claim 10, wherein determining the trigger type capable of stably triggering the to-be-triggered signal according to the characteristic parameter data comprises:
  determining the trigger type capable of stably triggering the to-be-triggered signal according to different information comprised in the characteristic parameter data, wherein the characteristic parameter data comprises peak-to-peak value variation information, edge slope variation information, frequency variation information, pulse width variation information and envelope variation information.

* * * * *